(12) United States Patent
Hendrickson

(10) Patent No.: US 8,788,868 B2
(45) Date of Patent: Jul. 22, 2014

(54) CLOCK CIRCUITS AND METHODS

(75) Inventor: Nicholas T. Hendrickson, Rancho Cordova, CA (US)

(73) Assignee: Micron Technology, Inc., Boise, ID (US)

(*) Notice: Subject to any disclaimer, the term of this patent is extended or adjusted under 35 U.S.C. 154(b) by 138 days.

(21) Appl. No.: 13/215,970

(22) Filed: Aug. 23, 2011

(65) Prior Publication Data

US 2013/0051140 A1    Feb. 28, 2013

(51) Int. Cl.
  *G06F 1/12* (2006.01)
(52) U.S. Cl.
  CPC .......................................... *G06F 1/12* (2013.01)
  USPC ............................................................ 713/500
(58) Field of Classification Search
  USPC .......................................................... 327/47
  See application file for complete search history.

(56) References Cited

U.S. PATENT DOCUMENTS

| | | | |
|---|---|---|---|
| 6,651,031 B2 | 11/2003 | Akopian | |
| 6,816,979 B1 * | 11/2004 | Chen et al. | 713/400 |
| 7,023,905 B2 * | 4/2006 | Farine et al. | 375/150 |
| 7,660,186 B2 | 2/2010 | Yeung et al. | |
| 2001/0044280 A1 * | 11/2001 | Samuels | 455/77 |
| 2003/0018462 A1 | 1/2003 | Chen | |
| 2009/0189658 A1 * | 7/2009 | Tomar et al. | 327/158 |
| 2009/0323444 A1 | 12/2009 | Kim et al. | |
| 2010/0013617 A1 * | 1/2010 | Fujita et al. | 340/443 |
| 2010/0174915 A1 * | 7/2010 | Prokin | 713/189 |
| 2010/0176878 A1 * | 7/2010 | Drost et al. | 327/594 |
| 2011/0145623 A1 * | 6/2011 | May | 713/503 |
| 2012/0226827 A1 * | 9/2012 | Raju et al. | 710/5 |

* cited by examiner

*Primary Examiner* — Hoai V Ho
*Assistant Examiner* — Min Huang
(74) *Attorney, Agent, or Firm* — Schwegman, Lundberg & Woessner, P.A.

(57) ABSTRACT

Integrated circuits, apparatuses and methods are disclosed, such as a method that includes generating an internal clock signal, receiving an external clock signal, and providing a mixed clock signal at an output. The mixed clock signal has a frequency ranging from a defined maximum frequency of the external clock signal to a frequency margin below a frequency of the internal clock signal. Additional integrated circuits, apparatus and methods are described.

19 Claims, 5 Drawing Sheets

CLOCK CIRCUITS AND METHODS

BACKGROUND

Integrated circuits, including memory devices, often are used in computers and other electronic products, e.g., digital televisions, digital cameras, and cellular phones, to store data and other information. The timing of operations in an integrated circuit is governed by a clock signal.

BRIEF DESCRIPTION OF THE DRAWINGS

Some embodiments are illustrated by way of example and not limitation in the figures of the accompanying drawings in which.

DETAILED DESCRIPTION

Integrated circuits may receive a clock signal from an external source such as a crystal oscillator. Some components of an integrated circuit may be harmed by a clock signal frequency that is too high or too low. The clock signal from the external source can be called an external clock signal. The external clock signal is often defined by a maximum frequency which is the highest frequency at which the integrated circuit is designed to safely operate, and is received at an unknown frequency that is often less than the defined maximum frequency. In some instances, no (at least practical) minimum frequency is defined, meaning some components of the integrated circuit may potentially operate at a frequency that is too slow for safe operation. For example, some components of an integrated circuit may be damaged if internal algorithms of the integrated circuit operate too long with a clock signal that is too slow. In addition, there are time-based hazards that may be accelerated by a low frequency clock signal. For example, program disturb occurs when heat dissipated during programming of a memory cell corrupts neighboring cells. The longer the heat is present, the greater the potential for program disturb. Energy is wasted if programming of a memory cell takes longer than necessary. Finally, voltages used during programming stress the memory device, and the stress is greater for a longer a programming operation. The inventor has discovered that the challenges noted above, as well as others, can be addressed by comparing the external clock signal with an internal clock signal generated in the integrated circuit, and choosing to operate according to the internal clock signal if the external clock signal is too slow.

For the purposes of this document, a high signal is a high voltage signal that can be represented by a "1", and a low signal is a low voltage signal that can be represented by a "0".

Figure 1:
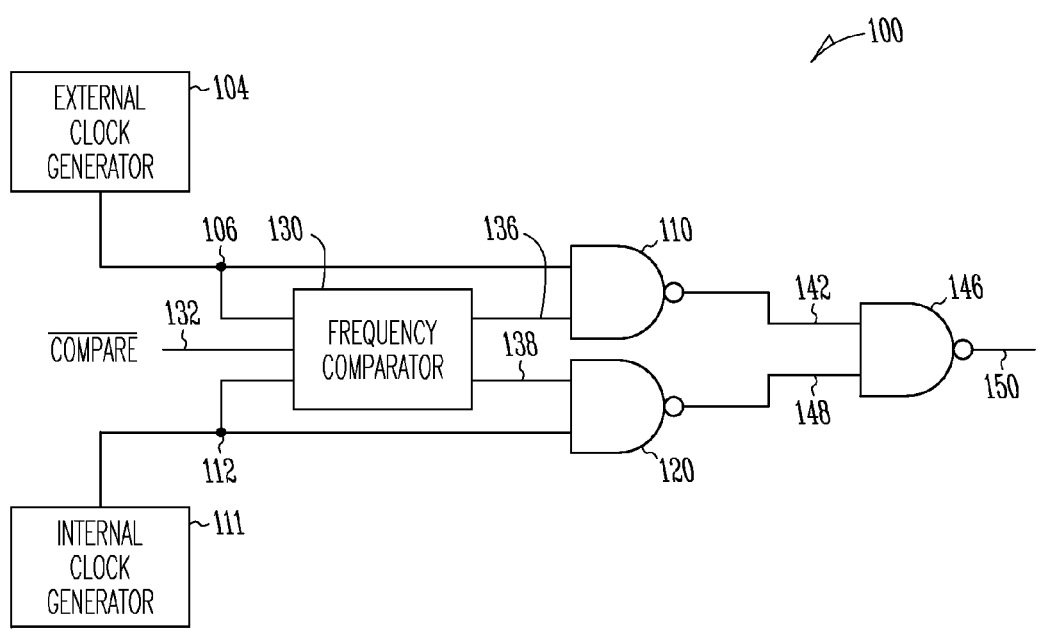
FIG. 1 is an electrical schematic diagram of a clock circuit according to various embodiments of the invention.

FIG. 1 is an electrical schematic diagram of a clock circuit 100 according to various embodiments of the invention. An external clock signal is received from an external clock generator 104 at an input 106 of a first NOT AND (NAND) gate 110, and an internal clock signal is received from an internal clock generator 111 at an input 112 of a second NAND gate 120. The external clock generator 104 can be a crystal oscillator, for example. The internal clock generator 111 can be, for example, a monostable multivibrator or a ring oscillator. The internal clock signal has a frequency that can be as low as a lowest frequency of a clock signal at which an integrated circuit is designed to safely operate (e.g., the lowest frequency that the integrated circuit may operate without a substantial risk of damage or error). The frequency of the internal clock signal may alternatively be higher than the lowest frequency at which the integrated circuit is designed to safely operate.

The external clock signal at the input 106 and the internal clock signal at the input 112 are also received by a frequency comparator 130 (e.g., a compare circuit). The frequency comparator 130 receives a compare bar signal at an input 132. The compare bar signal is an active low signal that can initiate a comparison between the external clock signal and the internal clock signal in the frequency comparator 130. The compare bar signal will be further described with respect to FIG. 2. The frequency comparator 130 can provide (e.g., generate) an external clock enable signal to a mixed clock circuit, such as one comprising NAND gates 110, 120 and 146, such as by providing the external clock enable signal at a second input 136 of the first NAND gate 110. The frequency comparator 130 can also provide an internal clock enable signal at a second input 138 of the second NAND gate 120. An output of the first NAND gate 110 is coupled to a first input 142 of a third NAND gate 146 and an output of the second NAND gate 120 is coupled to a second input 148 of the third NAND gate 146. A mixed clock signal is provided at an output 150 of the third NAND gate 146. The mixed clock signal can be the external clock signal if the external clock signal has a higher frequency than the internal clock signal or has a lower frequency than the internal clock signal but is within a frequency margin of the internal clock signal. The mixed clock signal is the internal clock signal if the internal clock signal has a frequency that is higher than the frequency of the external clock signal plus the frequency margin as will be described below. Such a mixed clock signal can be provided by blocking (e.g., using logic gates, such as NAND gates) the internal clock signal from being provided at the output 150 or blocking the external clock signal from being provided to the output 150.

Figure 2:
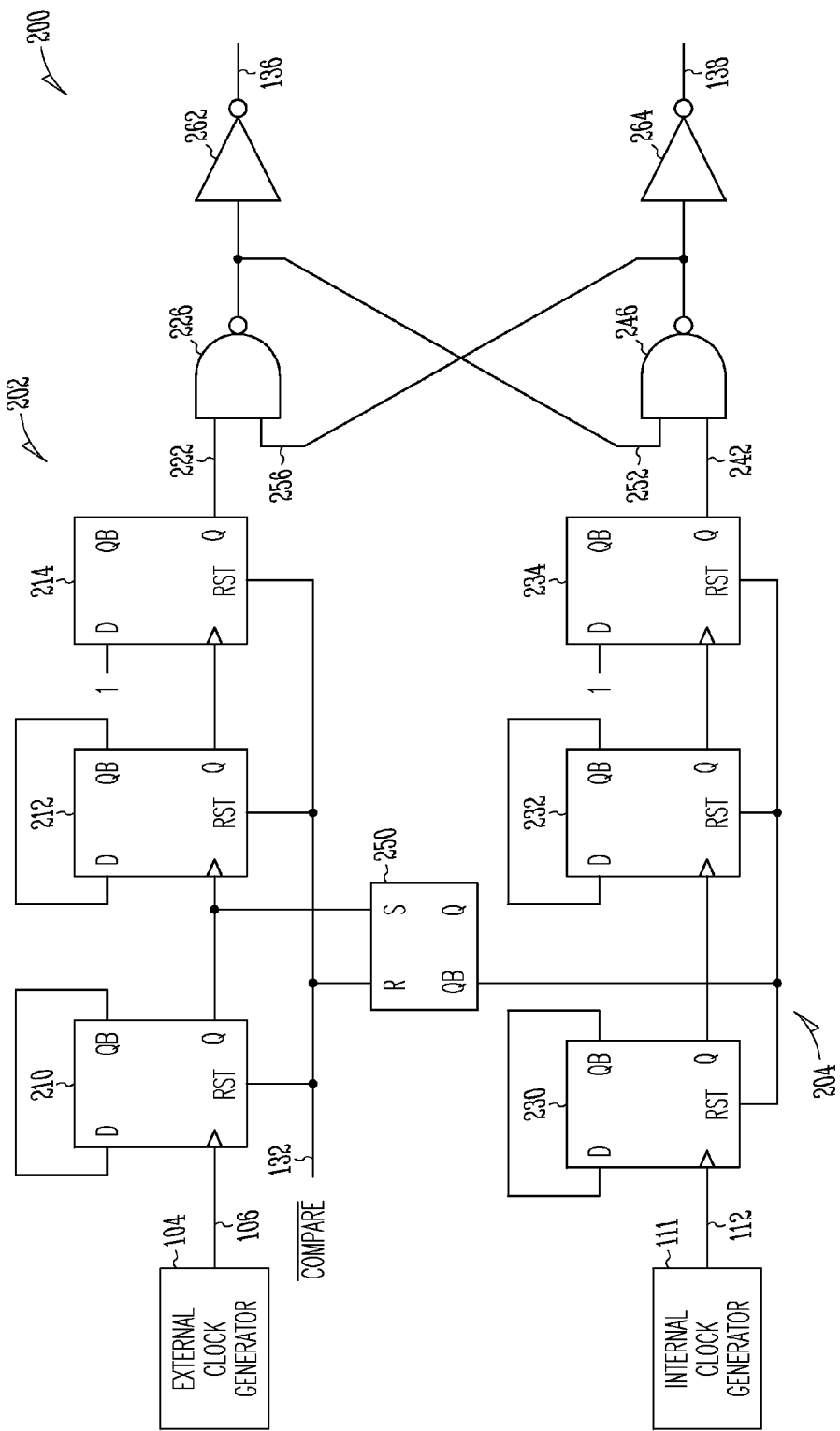
FIG. 2 is an electrical schematic diagram of a frequency comparator according to various embodiments of the invention.

FIG. 2 is an electrical schematic diagram of a frequency comparator 200 according to various embodiments of the invention. The frequency comparator 200 can be the frequency comparator 130 shown and described with respect to FIG. 1. The external clock signal from the external clock generator 104 at the input 106 is received in a clock input of a first D flip-flop 210. A D input is coupled to a QB output of the first D flip-flop 210. A Q output of the first D flip-flop 210 is coupled to a clock input of a second D flip-flop 212 which also has a D input coupled to a QB output. A Q output of the second D flip-flop 212 is coupled to a clock input of a third D flip-flop 214. A high signal "1" is provided to a D input of the third D flip-flop 214, and a Q output of the third D flip-flop 214 is coupled to a first input 222 of a fourth NAND gate 226.

The internal clock signal from the internal clock generator 111 at the input 112 is received in a clock input of a fourth D flip-flop 230 having a D input coupled to a QB output. A Q output of the fourth D flip-flop 230 is coupled to a clock input of a fifth D flip-flop 232 having a D input coupled to a QB output. A Q output of the fifth D flip-flop 232 is coupled to a clock input of a sixth D flip-flop 234 having a D input coupled to a high signal "1". A Q output of the sixth D flip-flop 234 is coupled to a first input 242 of a fifth NAND gate 246.

The compare bar signal at the input 132 is coupled to reset inputs of the D flip-flops 210, 212 and 214 and to an R input of an SR latch 250. The Q output of the first D flip-flop 210 is coupled to an S input of the SR latch 250. A QB output of the SR latch 250 is coupled to reset inputs of the D flip-flops 230, 232 and 234.

The frequency comparator 200 can compare the frequency of the external clock signal with the frequency of the internal clock signal by latching a result of a race between the two clock signals through respective pulse counters.

The D flip-flops 210, 212 and 214 are a pulse counter for the external clock signal. The D flip-flops 210 and 212 are frequency dividers to divide the external clock signal by two at the Q output of the first D flip-flop 210 and by four at the Q output of the second D flip-flop 212. The compare bar signal at the input 132 coupled to the reset inputs of the D flip-flops 210, 212 and 214 is usually high to force the Q outputs of the D flip-flops 210, 212 and 214 to a low signal. The compare bar signal goes low for a period of time to allow the frequency comparator 200 to compare the frequency of the external clock signal with the frequency of the internal clock signal. The low compare bar signal at the reset inputs of the D flip-flops 210, 212 and 214 allows the D flip-flops 210, 212 and 214 to provide a divided external clock signal at the Q outputs of the D flip-flops 210 and 212. A rising edge of the divided external clock signal at the clock input of the third D flip-flop 214 provides a high signal at the Q output of the third D flip-flop 214 and the first input 222 of the fourth NAND gate 226 due to the high signal at the D input of the third D flip-flop 214. The high signal at the Q output of the third D flip-flop 214 indicates an end of the race for the external clock signal.

The D flip-flops 230, 232 and 234 are a pulse counter for the internal clock signal. The D flip-flops 230 and 232 are frequency dividers to divide the internal clock signal by two at the Q output of the fourth D flip-flop 230 and by four at the Q output of the fifth D flip-flop 232. The compare bar signal at the input 132 coupled to the R input of the SR latch 250 forces the QB output of the SR latch 250 high when the compare bar signal is high to force the Q outputs of the D flip-flops 230, 232 and 234 to a low signal. When the compare bar signal goes low the QB output of the SR latch 250 does not go low until the S input of the SR latch 250 is raised by a rising edge of the Q output of the first D flip-flop 210. The QB output of the SR latch 250 is low for a period of time to allow the D flip-flops 230, 232 and 234 to provide a divided internal clock signal at the Q outputs of the D flip-flops 230 and 232. A rising edge of the divided internal clock signal at the clock input of the sixth D flip-flop 234 provides a high signal at the Q output of the sixth D flip-flop 234 and the first input 242 of the fifth NAND gate 246 due to the high signal at the D input of the sixth D flip-flop 234. The high signal at the Q output of the sixth D flip-flop 234 indicates an end of the race for the internal clock signal.

The SR latch 250 does not change state until the external clock signal works its way through the first D flip-flop 210. The SR latch 250 gives the external clock signal a head start in the race with the internal clock signal such that the external clock signal will win the race, for example, when it has a higher frequency but lags behind the internal clock signal. The external clock signal may also win the race even if it has a lower frequency than the internal clock signal due to the SR latch 250.

A second input 252 of the fifth NAND gate 246 is coupled to an output of the fourth NAND gate 226, and a second input 256 of the fourth NAND gate 226 is coupled to an output of the fifth NAND gate 246. The output of the fourth NAND gate 226 is coupled to an inverter 262, the inverter 262 to provide the external clock enable signal at the second input 136 of the first NAND gate 110 shown in FIG. 1. An output of the fifth NAND gate 246 is coupled to an inverter 264, the inverter 264 to provide the internal clock enable signal at the second input 138 of the second NAND gate 120 shown in FIG. 1. The fourth NAND gate 226 and the fifth NAND gate 246 latch the result of the race between the external clock signal and the internal clock signal. One of the first input 222 of the fourth NAND gate 226 and the first input 242 of the fifth NAND gate 246 goes high while the other remains low. Once this occurs, the NAND gate 226 or 246 receiving the high signal will provide a low output signal that is coupled to the second input 256 or 252 of the other NAND gate 226 or 246 to latch the result.

If the external clock signal has a higher frequency than the internal clock signal, the first input 222 of the fourth NAND gate 226 will go high first, and the fourth NAND gate 226 will provide a low output signal that is inverted by the inverter 262 into a high external clock enable signal while the internal clock enable signal remains low. With reference to FIG. 1, the high external clock enable signal is provided to the second input 136 of the first NAND gate 110 to allow the first NAND gate 110 to provide (e.g., pass) the external clock signal to the first input 142 of the third NAND gate 146. The second NAND gate 120 provides (e.g., applies) a high signal to the second input 148 of the third NAND gate 146. The mixed clock signal at the output 150 has a frequency of the external clock signal.

If the frequency of the internal clock signal is greater than the frequency of the external clock signal by more than the frequency margin, the first input 242 of the fifth NAND gate 246 will go high first, and the fifth NAND gate 246 will provide a low output signal that is inverted by the inverter 264 into a high internal clock enable signal while the external clock enable signal remains low. With reference to FIG. 1, the high internal clock enable signal is provided to the second input 138 of the second NAND gate 120 to allow the second NAND gate 120 to provide the internal clock signal to the second input 148 of the third NAND gate 146. The first NAND gate 110 provides a high signal at the first input 142 of the third NAND gate 146. The mixed clock signal at the output 150 has a frequency of the internal clock signal.

The frequency of the external clock signal may be the frequency of the mixed clock signal at the output 150 if it is substantially equal to the frequency of the internal clock signal. The frequency of the external clock signal may also be the frequency of the mixed clock signal at the output 150 if it is less than the frequency of the internal clock signal by less than the frequency margin when the two signals are out of phase. The external clock signal is given a preference over the internal clock signal by the SR latch 250 discussed above. The frequency margin is a fraction of the range of frequencies within which the integrated circuit is designed to safely operate. The magnitude of the frequency margin depends, at least in part, on the number of flip-flops in the pulse counters of the frequency comparator 200. The frequency margin is reduced by increasing the number of flip-flops in the frequency comparator 200. The mixed clock signal at the output 150 therefore has a low frequency boundary, but its frequency is not necessarily the higher of the external clock signal and the internal clock signal. For the frequency comparator 200 shown in FIG. 2, the external clock signal can be approximately 25% slower than the internal clock signal and have its frequency become the frequency of the mixed clock signal at the output 150.

Figure 3:
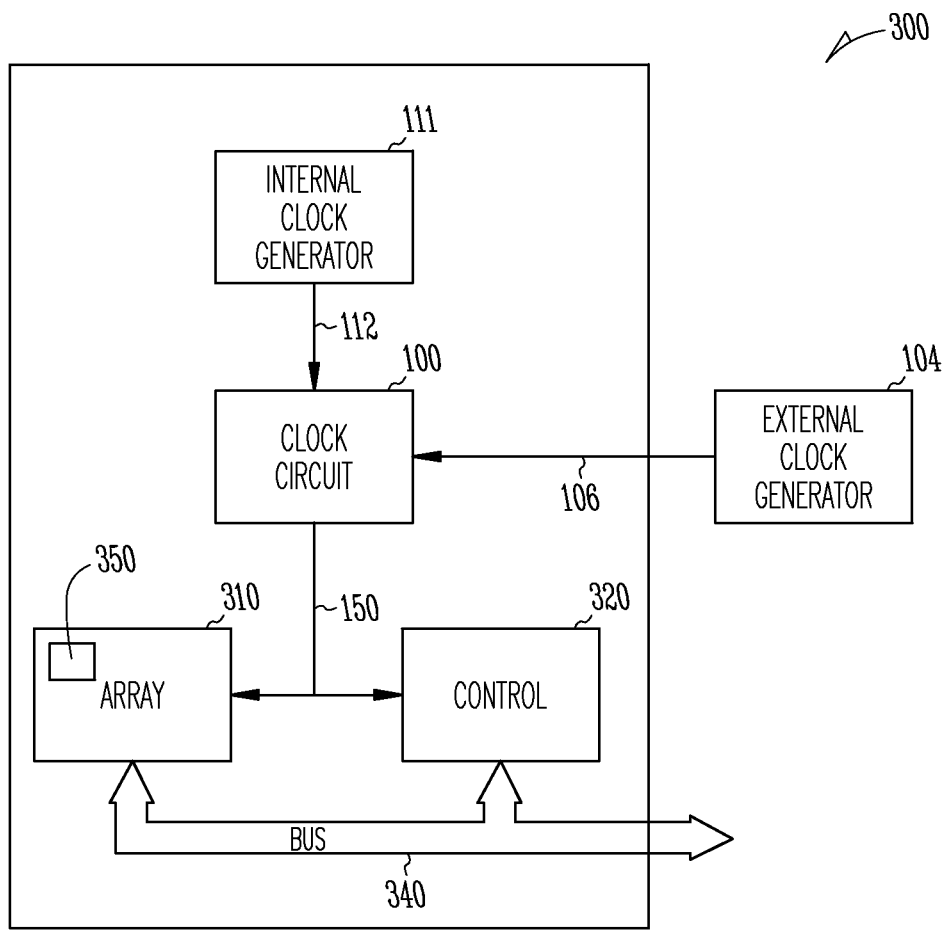
FIG. 3 is a block diagram of an integrated circuit according to various embodiments of the invention.

FIG. 3 is a block diagram of an integrated circuit 300 according to various embodiments of the invention. The integrated circuit 300 is fabricated on an integrated circuit chip comprising a semiconductor material and includes the clock circuit 100 shown in FIG. 1. An external clock signal is received from the external clock generator 104 at the input 106. The external clock generator 104 is external to the integrated circuit 300. An internal clock signal is received from the internal clock generator 111 at the input 112. The internal clock generator 111 and the input 112 are formed with the clock circuit 100 in the integrated circuit 300. An array of memory cells 310 and/or a controller (e.g., a control circuit) 320 operate according to a mixed clock signal that is provided from the output 150 of the clock circuit 100 to the array of memory cells 310 and/or the controller 320. The controller 320 and the array of memory cells 310 are formed with the clock circuit 100 in the integrated circuit 300. The controller 320 and the array of memory cells 310 receive or send address, data and control signals through a bus 340 that is to be coupled to devices outside the integrated circuit 300.

The memory cells in the array of memory cells 310 including a memory cell 350 can be non-volatile memory cells, such as floating-gate memory cells, charge trap memory cells or phase change memory cells. The memory cells in the array of memory cells 310 including the memory cell 350 are programmed, read and erased with the mixed clock signal that is provided from the output 150 of the clock circuit 100. Program disturb, energy use and voltage stress can all be reduced when the memory cells in the array of memory cells 310 including the memory cell 350 are programmed, read and erased with the mixed clock signal that is provided from the output 150 of the clock circuit 100.

Figure 4:
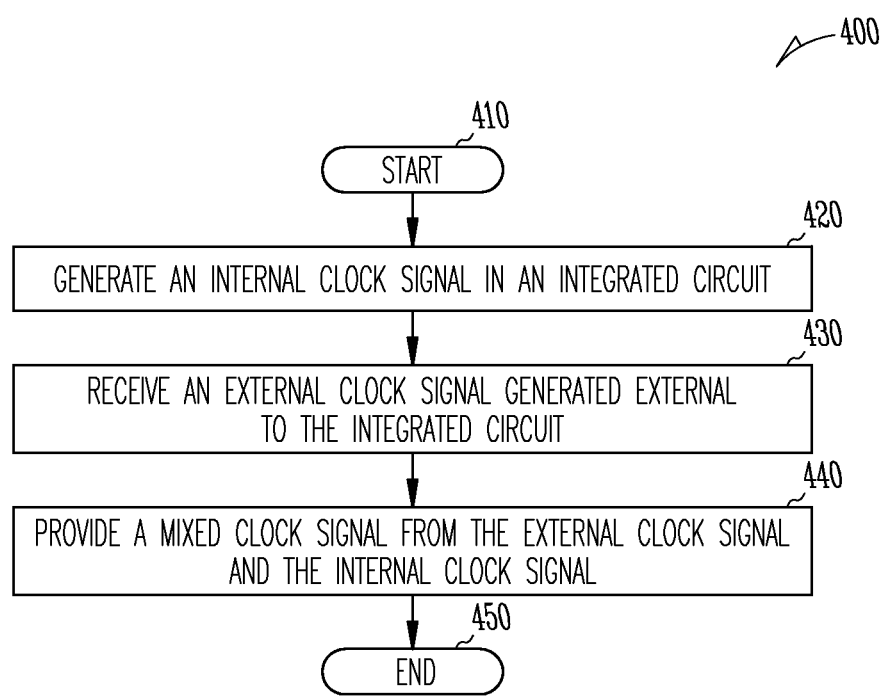
FIG. 4 is a flow diagram of a method according to various embodiments of the invention.

FIG. 4 is a flow diagram of a method 400 according to various embodiments of the invention. In block 410, the method 400 starts. In block 420, an internal clock signal is generated in an integrated circuit. In block 430, an external clock signal generated external to the integrated circuit is received. In block 440, a mixed clock signal is provided from the external clock signal and the internal clock signal. In block 450, the method 400 ends. Various embodiments may have more or fewer activities than those shown in FIG. 4. In some embodiments, the activities may be repeated, and/or performed in serial or parallel fashion. Some embodiments may comprise the same activities in a different order.

Figure 5:
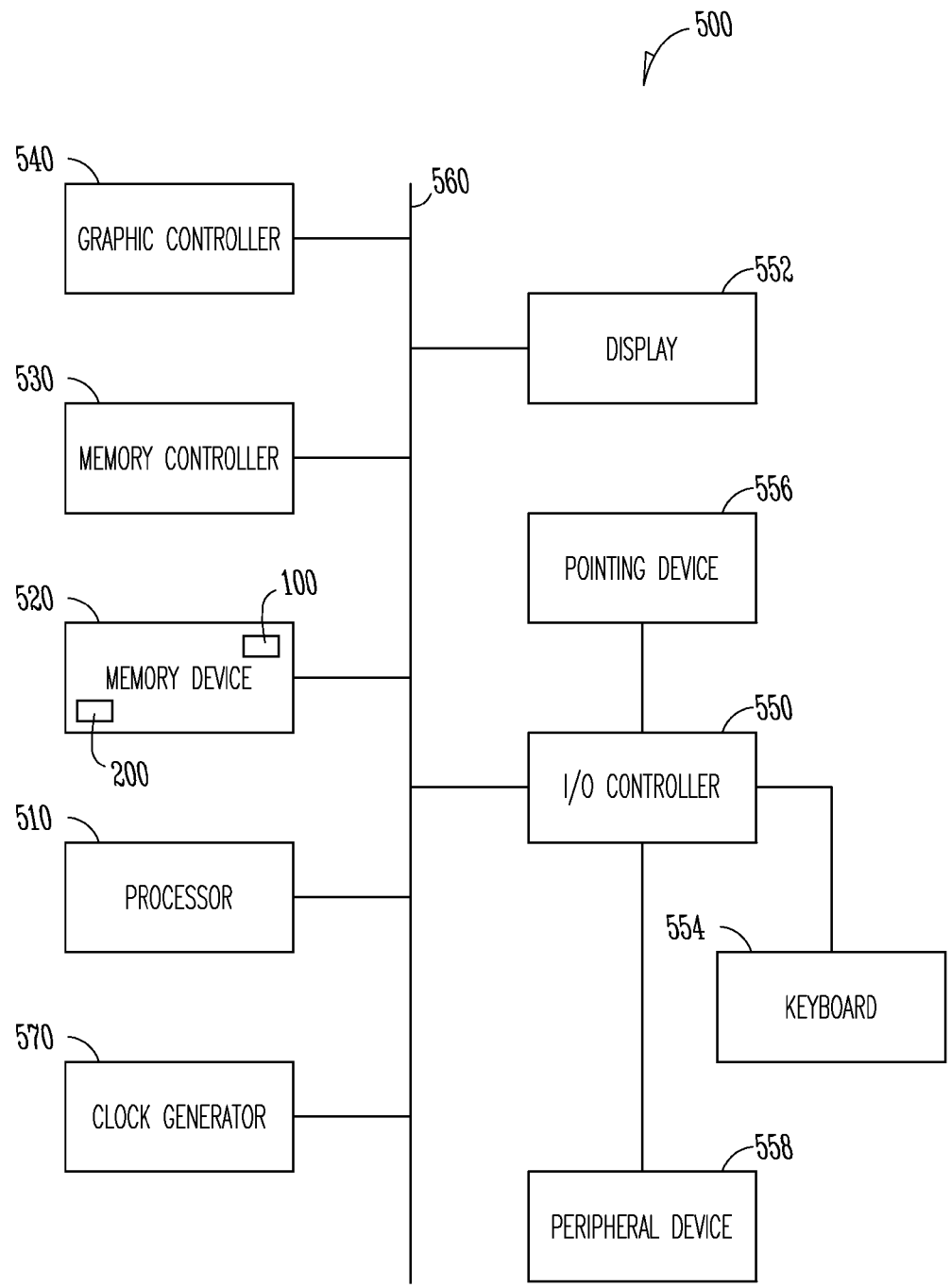
FIG. 5 is a diagram illustrating a system according to various embodiments of the invention.

FIG. 5 is a diagram illustrating a system 500 according to various embodiments of the invention. The system 500 may include a processor 510, a memory device 520, a memory controller 530, a graphic controller 540, an input and output (I/O) controller 550, a display 552, a keyboard 554, a pointing device 556, and a peripheral device 558. A bus 560 couples all of these devices together. An external clock generator 570 is coupled to the bus 560 to provide a clock signal to at least one of the devices of the system 500 through the bus 560. The external clock generator 570 can include a crystal oscillator in a circuit board such as a motherboard. Two or more devices shown in system 500 may be formed in a single integrated circuit chip. The memory device 520 may comprise the clock circuit 100, and may also comprise the frequency comparator 200, described herein and shown in the figures (e.g., see FIGS. 1 and 2) according to various embodiments of the invention.

The bus 560 may be interconnect traces on a circuit board or may be one or more cables. The bus 560 may couple the devices of the system 500 by wireless means such as by electromagnetic radiations, for example, radio waves. The peripheral device 558 coupled to the I/O controller 550 may be a printer, an optical device such as a CD-ROM and a DVD reader and writer, a magnetic device reader and writer such as a floppy disk driver, or an audio device such as a microphone.

The system 500 represented by FIG. 5 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

The various embodiments of the invention described herein and shown in FIGS. 1-5 can, for example, be used to protect an integrated circuit when an external clock signal has a low frequency that may damage the integrated circuit. The integrated circuit can instead be operated according to an internal clock signal having an acceptable frequency if the frequency of the external clock signal is too low.

Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An integrated circuit comprising:
a first input to receive an internal clock signal;
a second input to receive an external clock signal; and
a comparator coupled to the first input and the second input, the comparator comprising:
a first plurality of flip-flops coupled to the first input;
a second plurality of flip-flops coupled to the second input; and
a latch, coupled to an output of the first plurality of flip-flops and an output of the second plurality of flip-flops, that provides either an enable signal for the external clock signal or an enable signal for the internal clock signal in response to the frequency of the external clock signal being less than the frequency of the internal clock signal by less than the frequency margin wherein the frequency margin is determined by a quantity of flip-flops in each of the first and second pluralities of flip-flops.

2. The integrated circuit of claim 1, wherein the comparator comprises a frequency comparator to compare the frequency of the external clock signal with the frequency of the internal clock signal.

3. The integrated circuit of claim 2, wherein:
the comparator includes logic gates to block the internal clock signal from being provided at the output if the external clock signal is to be provided at the output; and
the comparator includes logic gates to block the external clock signal from being provided at the output if the internal clock signal is to be provided at the output.

4. The integrated circuit of claim 3, wherein:

the logic gates to block the internal clock signal comprise NOT AND (NAND) gates; and the logic gates to block the external clock signal comprise NAND gates.

5. The integrated circuit of claim 1, further comprising:

a monostable multivibrator or a ring oscillator to generate the internal clock signal; and wherein the external clock signal is generated by a crystal oscillator external to the integrated circuit.

6. An apparatus comprising:

a clock generator circuit in an integrated circuit to generate an internal clock signal;

an input to receive an external clock signal generated external to the integrated circuit;

a comparator to compare a frequency of the external clock signal with a frequency of the internal clock signal, the comparator comprising:
  a first plurality of flip-flops coupled to the input;
  a second plurality of flip-flops coupled to the internal clock signal; and
  a latch, coupled to an output of the first plurality of flip-flops and an output of the second plurality of flip-flops, that provides an external clock enable signal and an internal clock enable signal; and a mixed clock circuit coupled to the input and the clock generator circuit to provide at an output one of the internal clock signal or the external clock signal based on the internal clock enable signal and the external clock enable signal, respectively.

7. The apparatus of claim 6, wherein the comparator comprises a frequency comparator to conduct a race between the external clock signal and the internal clock signal.

8. The apparatus of claim 6, wherein the integrated circuit further comprises an array of non-volatile memory cells coupled to receive the clock signal provided at the output to program the non-volatile memory cells.

9. The apparatus of claim 6, wherein the comparator includes an input to receive a compare signal to initiate a comparison between the external clock signal and the internal clock signal.

10. A method comprising:

generating an internal clock signal;

receiving an external clock signal;

generating a plurality of enable signals in response to a comparison of the internal clock signal to the external clock signal using a first plurality of flip-flops coupled to the internal clock signal and a second plurality of flip-flops coupled to the external clock signal; and providing, in response to the plurality of enable signer, a mixed clock signal at an output, the mixed clock signal having a frequency ranging from a defined maximum frequency of the external clock signal to a frequency within a frequency margin of the internal clock signal.

11. The method of claim 10, further comprising comparing a frequency of the external clock signal with the frequency of the internal clock signal, wherein the mixed clock signal is provided responsive to the comparison.

12. The method of claim 10, wherein providing a mixed clock signal at the output comprises:

providing the external clock signal at the output if the frequency of the external clock signal is higher than the frequency of the internal clock signal;

providing the internal clock signal at the output if the frequency of the internal clock signal is greater than a frequency margin above the frequency of the external clock signal; and providing either the external clock signal or the internal clock signal at the output if the frequency of the external clock signal is less than the frequency of the internal clock signal by less than the frequency margin.

13. The method of claim 10, further comprising programming floating-gate memory cells in an array of non-volatile memory cells with the mixed clock signal.

14. The method of claim 10, wherein receiving the external clock signal further comprises receiving the external clock signal from a crystal oscillator.

15. The method of claim 10, wherein generating the internal clock signal further comprises generating the internal clock signal using a monostable multivibrator or a ring oscillator in the integrated circuit.

16. A method comprising:

generating an internal clock signal;

receiving an external clock signal;

providing the internal clock signal to a first plurality of flip-flops;

providing the external clock signal to a second plurality of flip-flops;

generating one of a first enable signal or a second enable signal in response to comparing an output of the first plurality of flip-flops with an output of the second plurality of flip-flops;

operating the integrated circuit according to a mixed clock signal having a frequency that is the frequency of the external clock signal unless the frequency of the external clock signal is more than a frequency margin below the frequency of the internal clock signal; and operating the integrated circuit according to the mixed clock signal having the frequency of the internal clock signal if the frequency of the mixed clock signal is not to be the frequency of the external clock signal.

17. The method of claim 16, further comprising initiating the generating one of the first enable signal or the second enable signal responsive to a compare signal.

18. The method of claim 16, wherein operating the integrated circuit further comprises:

providing the external clock signal to a circuit in the integrated circuit if the frequency of the external clock signal is higher than the frequency of the internal clock signal or is within a frequency margin of the internal clock signal; and providing the internal clock signal to the circuit in the integrated circuit if the frequency of the internal clock signal is greater than the frequency of the external clock signal by at least the frequency margin.

19. The method of claim 16, further comprising programming phase change memory cells in an array of non-volatile memory cells in the integrated circuit with the mixed clock signal.

* * * * *

UNITED STATES PATENT AND TRADEMARK OFFICE
CERTIFICATE OF CORRECTION

PATENT NO. : 8,788,868 B2  
APPLICATION NO. : 13/215970  
DATED : July 22, 2014  
INVENTOR(S) : Nicholas T. Hendrickson Page 1 of 1

It is certified that error appears in the above-identified patent and that said Letters Patent is hereby corrected as shown below:

In the Claims

Column 7, line 49, in Claim 10, delete "signer," and insert -- signals, --, therefor.

Signed and Sealed this
Thirtieth Day of September, 2014

Michelle K. Lee
*Deputy Director of the United States Patent and Trademark Office*